United States Patent [19]

Mok

[11] Patent Number: 5,964,413
[45] Date of Patent: Oct. 12, 1999

[54] APPARATUS FOR DISPENSING SLURRY

[76] Inventor: Peter Mok, 1647 Lombard St., San Francisco, Calif. 94123

[21] Appl. No.: 08/965,067

[22] Filed: Nov. 5, 1997

[51] Int. Cl.$^6$ ............................. B05B 3/10; B05B 1/26
[52] U.S. Cl. ..................... 239/223; 239/224; 239/231; 239/502
[58] Field of Search ................... 239/223, 224, 239/219, 231, 502

[56] References Cited

U.S. PATENT DOCUMENTS

| Re. 30,963 | 6/1982 | Moller et al. | 239/224 |
|---|---|---|---|
| 3,711,025 | 1/1973 | Miller | 239/222.11 |
| 4,553,700 | 11/1985 | Snyder et al. | 239/223 X |
| 5,203,506 | 4/1993 | Gross et al. | 239/224 |
| 5,743,788 | 4/1998 | Vanell | 451/41 |
| 5,804,507 | 9/1998 | Perlov et al. | 438/692 |

*Primary Examiner*—Andres Kashnikow
*Assistant Examiner*—Robin O. Evans
*Attorney, Agent, or Firm*—Skjerven, Morrill, MacPherson, Franklin and Friel; Edward C. Kwok

[57] ABSTRACT

A slurry dispenser dispensing slurry by a rotating wheel is provided in a chemical-mechanical polishing process used in manufacturing integrated circuits. The slurry dispenser is driven by a variable speed motor at a predetermined speed empirically determined to dispense a desired amount of slurry. A groove is provided along the circumfrence of the rotating wheel to control the width of the spray. At the same time, walls in the housing of the slurry dispenser restrict the angle of the spray. The slurry dispenser can be constructed out of material chemically inert with respect to the slurry.

9 Claims, 4 Drawing Sheets

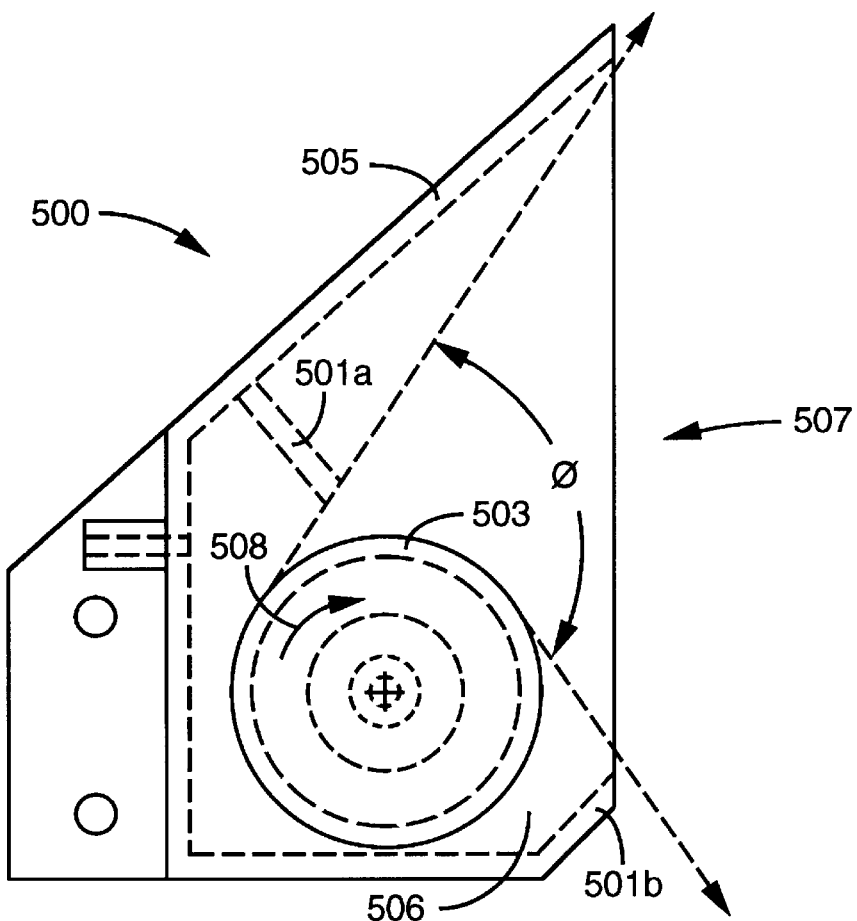
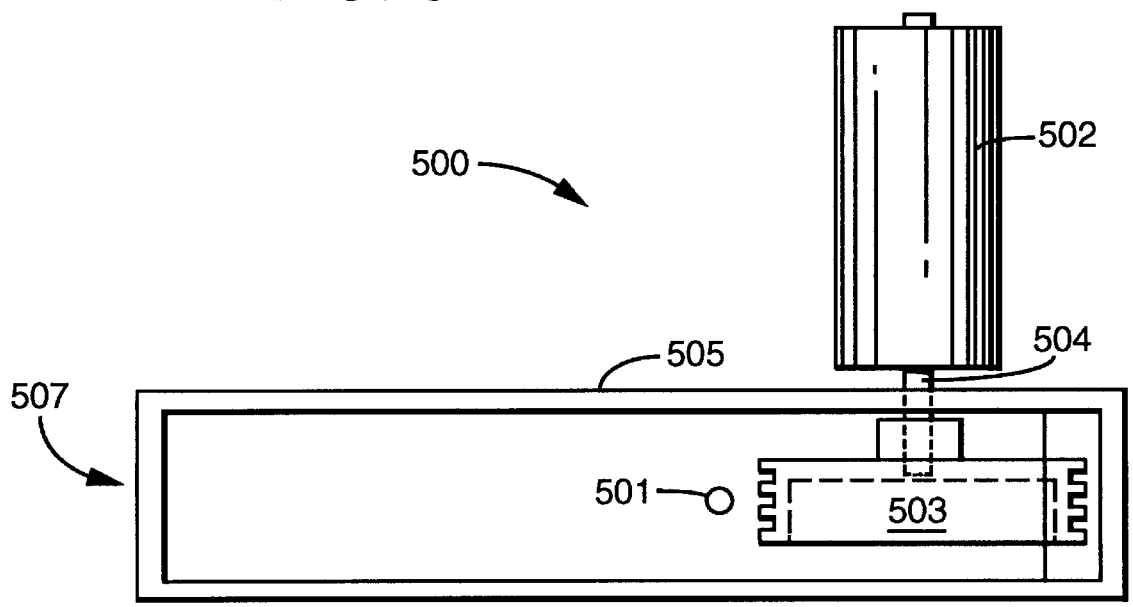
FIG. 5A
FIG. 5B

APPARATUS FOR DISPENSING SLURRY

BACKGROUND OF THE INVENTION

1. Field of the Invention

The present invention relates to dispensing a liquid. In particular, the present invention relates to dispensing slurry in a chemical-mechanical polishing (CMP) application.

2. Discussion of the Related Art

In sub-micron integrated circuits, CMP techniques are used to create the planarity required in multi-level interconnect structures. Specifically, to create a planar surface for depositing an interconnect layer, e.g. aluminum or titanium-tungsten, an interlayer dielectric (e.g., silicon dioxide) is planarized by a polishing process which uses a slightly alkaline colloidal slurry as a hydrolizing fine abrasive. One example of such a slurry includes fine silicon dioxide particles (e.g., average diameter of 70 nm) suspended in deionized water having an adjusted pH of approximately 11. The alkalinity can be provided by potassium hydroxide (KOH) and ammonium hydroxide ($NH_3OH$).

Typically, in a CMP polisher, the semiconductor wafer to be polished is held under slight pressure by a polishing head against a polishing pad. For a CMP application, the polishing pad is typically made of a polyurethane material. During the polishing process, the polishing head moves the semiconductor wafer according to a predetermined motion pattern. Alternatively, the polishing pad can be mounted on a platform which moves relative to the semiconductor wafer. The motion of the semiconductor wafer relative to the polishing pad and the mechanical and chemical actions of the slurry, together provide a polishing action for planarizing the surface of the wafer. In such a process, because the slurry has a high content of water, the slurry is not only an abrasive, but also acts as a coolant which maintains the surface of the wafer to an acceptable temperature.

In the prior art, the slurry is typically sprayed on to the surface of the polishing pad by appropriately positioned nozzles linked by a slurry supply line, and delivered to the surface of the polishing pad at 50 to 500 cc per minute using a peristaltic pump. However, a number of problems can develop over time under this arrangement. In particular, deposits from the slurry can clog the nozzles, leading to uneven and inadequate delivery. In some situations, uneven and inadequate slurry delivery can result in poor polishing uniformity and even severe damage to the wafer due to excessive heat. In addition, even when nozzles are in good working condition, it is difficult to control the amount of slurry that is dispensed.

SUMMARY OF THE INVENTION

In accordance with the present invention, a slurry dispenser which dispenses slurry from a rotating wheel is provided.

In one embodiment, the slurry dispenser includes: (a) a housing having an opening; (b) a reservoir provided inside the housing for holding the slurry; (c) a rotating mechanism, such as a motor, and (d) a wheel assembly provided within the housing and engaged to rotate with said rotational mechanism. In that embodiment, the wheel assembly includes a conical member inserted into the slurry reservoir and a disk portion. During operation, i.e., while the wheel assembly is rotated by the rotating mechanism, a stream of slurry is forced up a side wall of the conical member of the wheel assembly, so that the slurry is dispensed as a spray by the disk through the opening of the housing. The spray is created by a centrifugal force resulting from the rotation If a variable speed DC motor is used, the amount of slurry dispensed by the slurry dispenser can be controlled by an applied voltage to the motor.

In one embodiment, the disk of the wheel assembly includes a groove along its circumference, thus providing two edges which serve to restrict the spray to a thin layer. The housing, the wheel assembly and any surface that comes into contact with the slurry, can be constructed from material (e.g., polycarbonate, polypropylene, or any material with a teflon coating on exposed surfaces) which is chemically inert with respect to the slurry.

In one embodiment, the housing of the slurry dispenser includes wall portions in the proximity of the opening, such that the slurry spray is restricted to a predetermined angle.

An inlet is provided in the slurry dispenser for attaching a slurry supply line to maintain a continuous supply of slurry into the slurry reservoir of the slurry dispenser.

The slurry dispenser of the present invention allows fine control of the amount of slurry dispensed, so that waste of slurry is minimized.

The present invention is better understood upon consideration of the detailed description below in conjunction with the accompanying drawings.

BRIEF DESCRIPTION OF THE DRAWINGS

FIGS. 5a and 5b show, respectively, horizontal and vertical sectional views of slurry dispenser 500, in accordance with the present invention.

DETAILED DESCRIPTION OF THE PREFERRED EMBODIMENTS

Figure 1A:
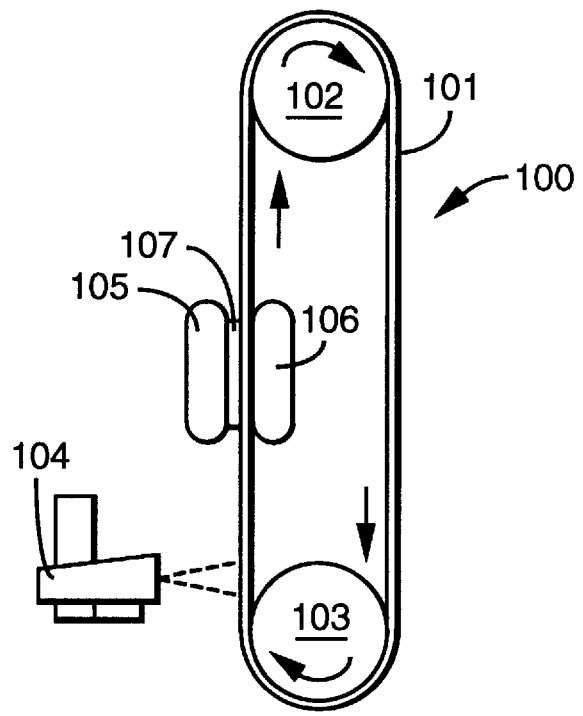
FIGS. 1a and 1b show, respectively, front and side views of a CMP apparatus 100, including a slurry dispenser 104, in accordance with the present invention.

The present invention provides a slurry dispenser free of the problems of the prior art described in the previous section. To simplify the detailed description below, like elements in the figures are provided like reference numerals.

Figure 1B:
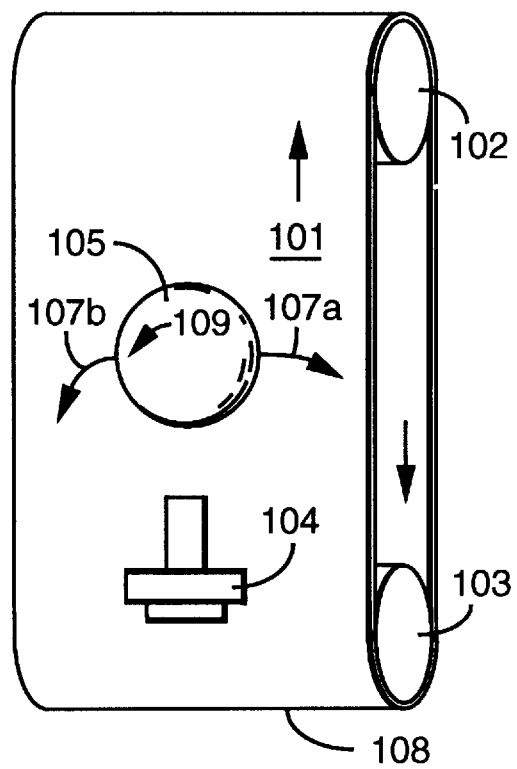

FIGS. 1a and 1b show CMP apparatus 100 in side and front views, respectively, in accordance with the present invention in side and front views. One example of a polishing apparatus suitable for use as CMP apparatus 100 is disclosed in a co-pending patent application, entitled "Modular Polishing Apparatus and Method," by P. Cheng et al., Ser. No. 08/964,930 filed on the same day as the present patent application, and assigned to Aplex, Inc., which is also the assignee of the present invention. As shown in FIGS. 1a and 1b, CMP apparatus 100 includes a continuous polishing belt 101 configured to polish one or more vertically held semiconductor wafers, such as wafer 107. Wafer 107 is held vertically by a polishing head 105, which presses wafer 107 against a polishing pad attached to a vertically mounted polishing belt 101. Polishing belt 101 is kept in continuous motion by rotating pulleys 102 and 103 at a selected polishing speed (e.g., 10 meters per second). A support head 106 provides a backward pressure to hold wafer 107 at a preselected pressure (e.g., 5 PSI) against polishing belt 101. Polishing head 105 rotates in a predetermined direction indicated by reference numeral 109 and is moved to and fro over the polishing pad surface along an arc indicated by reference numerals 107a and 107b. Thus the combined motions in polishing belt 101, and polishing head 105 provide linear polishing for the surface of wafer 107. While FIG. 1 shows only one side of the polishing belt assembly being used for wafer polishing, polishing heads and accompanying mechanisms can be provided on both sides of the polishing belt assembly of CMP apparatus 100 to increase the total wafer throughput.

Figure 2A:
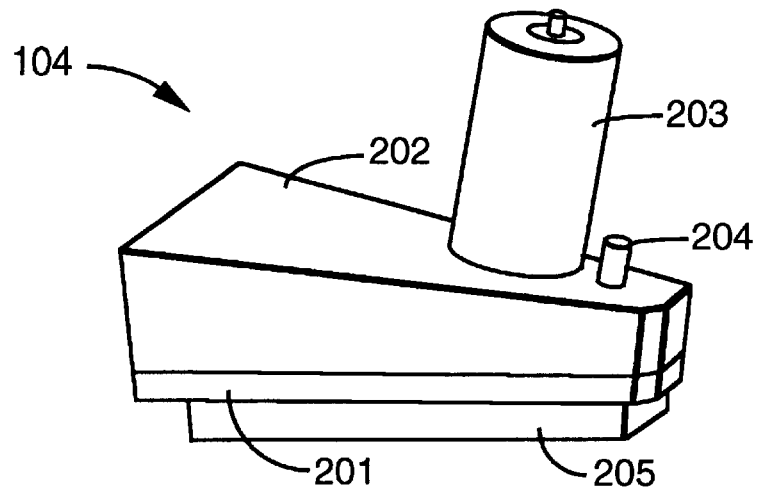
FIG. 2a shows an assembled side view of slurry dispenser 104.

The present invention provides a slurry dispenser 104, which is positioned at a short distance upstream (relative to polishing belt lolls direction of travel) from polishing head 105. Slurry dispenser 104 sprays a fine stream of slurry from a rapidly rotating wheel. FIG. 2a provides an assembled side view of slurry dispenser 104. As shown in FIG. 2a, slurry dispenser 104 includes (a) a lower housing 201, including a slurry reservoir 205, (b) an upper housing 202, fastened to lower housing 201 by, for example, set screws, and (c) a variable speed motor 203. A component wheel assembly is enclosed between lower and upper housings 201 and 202. Upper housing 202 includes a slurry inlet 204, which is connected during operation to a slurry supply line (not shown) to provide slurry dispenser 104 a continuous supply of slurry. A peristalic pump can be used to provide the slurry in the supply line. In this embodiment, upper and lower housings 202 and 201, and the component wheel assembly (shown in FIG. 2b), can be constructed out of polycarbonate (e.g., ⅛ inch thick polycarbonate), polypropylene, any material with a TEFLON (polytetrflouroethylene) coating on exposed surfaces, or any other material inert to the slurry (e.g. a hard plastic). Motor 203 is preferably a DC motor which speed can be varied by varying the magnitude of an applied voltage. Upper housing 202 has an opening at the front (i.e., opening 310 shown in FIGS. 3a, 3b and 4 and described below) so that a spray of slurry can be provided through that opening.

Figure 2B:
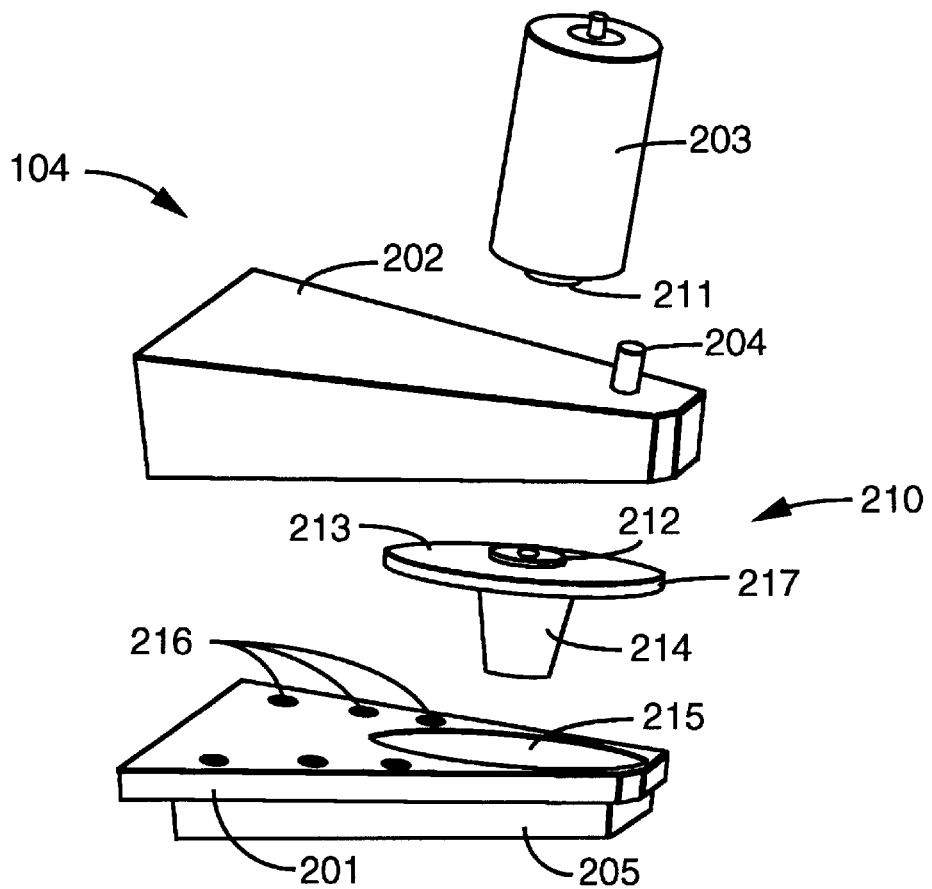
FIG. 2b shows an "exploded" side view of slurry dispenser 104.

FIG. 2b shows an "exploded" side view of slurry dispenser 104. As shown in FIG. 2b, in addition to motor 203, and upper and lower housings 201 and 202 (including slurry inlet 204 and slurry reservoir 205), dispenser 104 includes a wheel assembly 210, which has at least these members: (a) a linkage member 212, for engaging a rotating shaft 211 of motor 203, such that, during operation, wheel assembly 210 turns at the speed of motor 203, (b) a wheel or disk portion 213, including a groove 217 between its upper and lower surfaces, and (c) a conical member 214, attached to the lower surface of disk portion 213. FIG. 2b also shows a set of through holes 216, through which set screws can be provided to fasten upper housing 202 to lower housing 201, engaging corresponding threaded holes in upper housing 202. Conical member 214 is inserted into opening 215 in lower housing 201. Opening 215 opens into slurry reservoir 205.

Figure 3A:
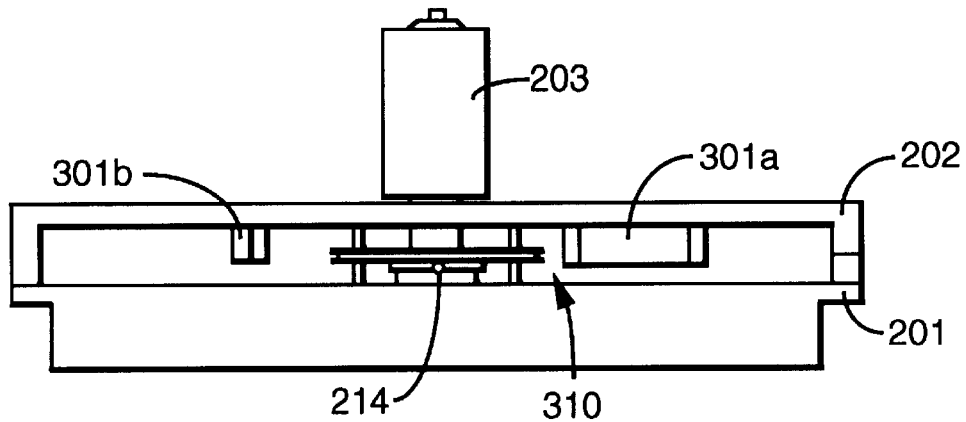
FIG. 3a shows a front view of slurry dispenser 104.

A front view of slurry dispenser 104 is provided in FIG. 3a, looking from the direction of front opening 310 in upper housing 202. As shown in FIG. 3a, two partial walls 301a and 301b are provided from the ceiling of upper housing 202. Partial walls 301a and 301b are provided to restrict the angle of the slurry spray from slurry dispenser 104.

Figure 3B:
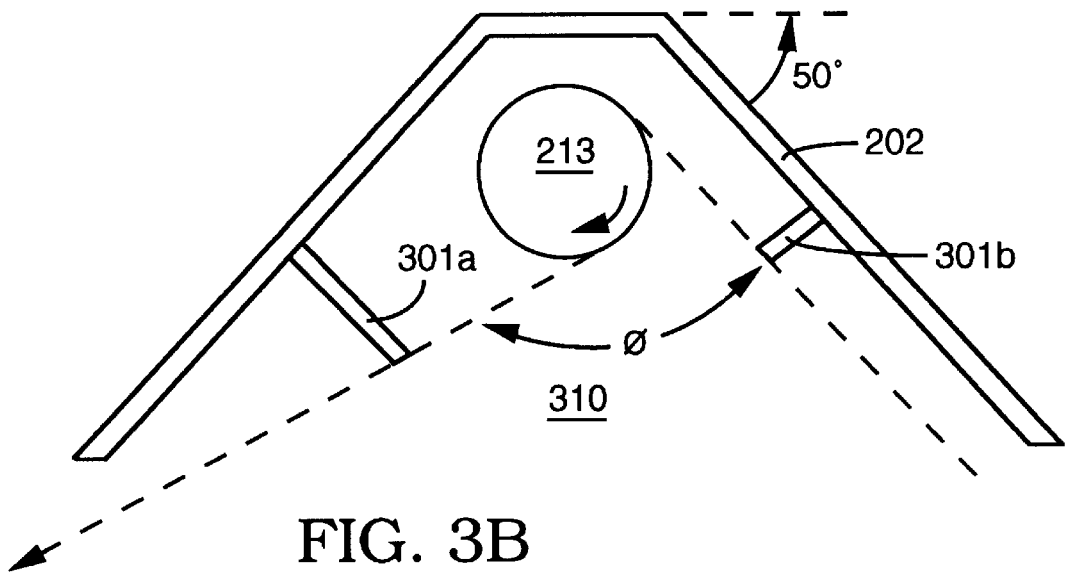
FIG. 3b illustrates the operation of slurry dispenser 104.
Figure 4:
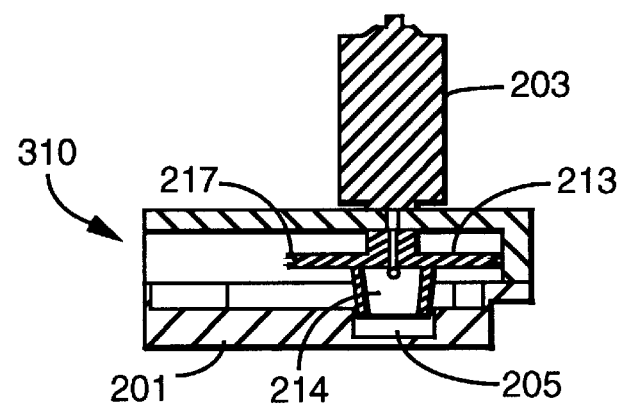
FIG. 4 illustrates the operation of slurry dispenser 104 using a vertical sectional view of slurry dispenser 104.

The operation of slurry dispenser 104 is described in conjunction with FIGS. 3b and FIG. 4. FIG. 3b is a view of slurry dispenser 104 viewed from the ceiling of upper housing 202 and FIG. 4 is a vertical sectional view of slurry dispenser 104. During operation, motor 203 turns wheel assembly 210 at a predetermined speed (e.g., 2000 to 3000 revolutions per minute). The desired operational speed of the motor is primarily determined by the amount of slurry required to be dispensed. Generally, a higher speed would dispense a greater amount of slurry. The actual speed required can be determined empirically. As shown in FIG. 4, at the operational speed, a stream of slurry is forced to creep up from slurry reservoir 205 along a side wall of conical member 214, due to the boundary layer created at the surface of conical member 214. This stream of slurry flow continues over the lower surface of disk portion 213 into groove 217. The centrifugal force of spinning wheel assembly 210 spray the slurry from groove 217 out of slurry dispenser 104 through opening 310 of upper housing 202. The sharp edges of disk portion 213, formed by the walls of groove 217, serve to restrict the spray to a thin layer in the vertical direction.

In this embodiment, the sloping sidewalls of conical member 214 are inclined 100 degrees from disk portion 213. As described above, walls 301a and 301b restrict the spray of slurry horizontally to the predetermined angle ∅ shown. The magnitude of this angle, hence the length of walls 301a and 301b is determined empirically. Slurry that flows out of slurry dispenser 104 (e.g., slurry caught by the walls of the housings) can be collected and recycled to avoid waste.

A second embodiment of the present invention is suitable for use with a polishing apparatus in which the polishing belt is vertically mounted but travels in a horizontal direction. (Consider, for example, rotating CMP apparatus 100 90 degrees in the plane of polishing pad 101). A rotating wheel in a slurry dispenser for such a polishing apparatus, unlike the rotating wheel in slurry dispenser 104 of FIGS. 1a and 1b (which rotates in a horizontal plane), rotates in a vertical plane. Clearly, in such an apparatus, the reservoir from which slurry is drawn cannot be provided in the same way as reservoir 205 of FIG. 4. FIGS. 5a and 5b show, respectively, horizontal and vertical sections through a slurry dispenser 500 suitable for implementing this second embodiment of the present invention.

As shown in FIG. 5a, slurry dispenser 500 sprays a stream of slurry from an opening 507 on the side of housing 505. A component wheel assembly 503, which is housed within housing 505, is rotated by a shaft 504 coupled to a variable speed motor 502 located outside of housing 505. As shown in FIG. 5b, component wheel assembly 503 is partially immersed in a slurry reservoir 506 located at the bottom of housing 505, such that, when component wheel assembly 503 is rotated by shaft 504 in the direction indicated by reference numeral 503, slurry is carried by rotating component wheel assembly 503 and sprayed out of opening 507 of housing 505 by the centrifugal force. Partial wall 501a and side wall 501b of reservoir 506 serve to restrict the angle φ of spray in substantially the same manner as partial walls 301a and 301b in slurry dispenser 104 of FIGS. 3a and 3b.

The detailed description above is provided to illustrate the specific embodiments described herein and is not intended to be limiting. Numerous variations and modifications within the scope of the present invention are possible. For example, while the present invention is illustrated by a CMP apparatus, the present invention is suitable for use with any polishing apparatus. The present invention is defined by the following claims.

I claim:

1. A slurry dispenser, comprising:

a housing having an opening;

a reservoir provided within said housing for holding a slurry;

a rotating mechanism; and a wheel assembly within said housing, said wheel assembly engaged to rotate with said rotating mechanism, said wheel assembly including a disk portion and a conduit for carrying said slurry from said reservoir to said disk portion, said conduit comprising a conical member inserted into said reservoir, such that when said wheel assembly is rotating, a stream of slurry is forced up along an outside side wall of said conical member into said disk portion and dispensed as a spray by said disk portion through said opening.

2. A slurry dispenser as in claim 1, further comprising a slurry inlet for providing a continuous supply of slurry into said reservoir.

3. A slurry dispenser as in claim 1, wherein said disk portion includes a groove along the circumference of said disk portion.

4. A slurry dispenser as in claim 1, wherein said rotating mechanism comprises a variable speed motor.

5. A slurry dispenser as in claim 1, wherein said wheel assembly and said housing comprises material chemically inert with respect to said slurry.

6. A slurry dispenser as in claim 5, wherein said material comprises polycarbonate.

7. A slurry dispenser as in claim 5, wherein said material comprises polypropylene.

8. A slurry dispenser as in claim 5, wherein said material comprises a polytetraflourethylene coating.

9. A slurry dispenser comprising:

a housing having an opening;

a reservoir provided within said housing for holding a slurry;

wall portions within said housing provided proximately to said opening;

a rotating mechanism; and a wheel assembly within said housing, said wheel assembly engaged to rotate with said rotating mechanism, said wheel assembly including a disk portion and a conduit for carrying said slurry from said reservoir to said disk portion, such that when said wheel assembly is rotating, a stream of slurry is forced up said conduit into said disk portion and dispensed as a spray by said disk portion through said opening, said spray being restricted by said wall portions to a predetermined angle.

* * * * *